(12) United States Patent
Zhao et al.

(10) Patent No.: US 11,930,690 B2
(45) Date of Patent: Mar. 12, 2024

(54) MASK PLATE

(71) Applicants: Chengdu BOE Optoelectronics Technology Co., Ltd., Sichuan (CN); BOE Technology Group Co., Ltd., Beijing (CN)

(72) Inventors: Yu Zhao, Beijing (CN); Peng Xu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 60 days.

(21) Appl. No.: 17/235,958

(22) Filed: Apr. 21, 2021

(65) Prior Publication Data

US 2021/0351351 A1 Nov. 11, 2021

(30) Foreign Application Priority Data

May 9, 2020 (CN) .......................... 202010388822.7

(51) Int. Cl.
| | |
|---|---|
| *C23C 14/04* | (2006.01) |
| *B05C 21/00* | (2006.01) |
| *C23C 14/24* | (2006.01) |
| *H10K 71/00* | (2023.01) |
| *H10K 71/16* | (2023.01) |

(52) U.S. Cl.
CPC ......... *H10K 71/166* (2023.02); *B05C 21/005* (2013.01); *C23C 14/042* (2013.01); *C23C 14/24* (2013.01); *H10K 71/00* (2023.02); *H10K 71/164* (2023.02)

(58) Field of Classification Search
None
See application file for complete search history.

(56) References Cited

U.S. PATENT DOCUMENTS

| | | | | |
|---|---|---|---|---|
| 8,151,729 B2 * | 4/2012 | Ko | ......................... | B23K 31/02 118/301 |
| 8,343,278 B2 * | 1/2013 | Sung | ..................... | C23C 14/042 118/721 |
| 8,631,761 B2 * | 1/2014 | Kang | ................... | C23C 14/042 118/721 |

(Continued)

FOREIGN PATENT DOCUMENTS

| | | |
|---|---|---|
| CN | 1535082 A | 10/2004 |
| CN | 108220885 A | 6/2018 |

OTHER PUBLICATIONS

Office Action dated Sep. 16, 2021 for Chinese Patent Application No. 202010388822.7 and English Translation.

*Primary Examiner* — Jethro M. Pence
(74) *Attorney, Agent, or Firm* — Ling Wu; Stephen Yang; Ling and Yang Intellectual Property

(57) ABSTRACT

The embodiments of the present disclosure provides a mask plate, including a rectangular area and two gripper areas which are respectively disposed on two opposite sides of the rectangular area, wherein each of the two gripper areas has a first side and a third side which are arranged opposite to each other, and a second side and a fourth side which are arranged opposite to each other, and the first side is disposed on a side of the rectangular area, and a minimum horizontal spacing between the second side and the fourth side is less than a side length of the first side.

18 Claims, 4 Drawing Sheets

(56) References Cited

U.S. PATENT DOCUMENTS

| | | | |
|---|---|---|---|
| 8,656,859 B2* | 2/2014 | Hong | H01L 51/0011 118/504 |
| 8,701,592 B2* | 4/2014 | Ko | C23C 14/042 118/301 |
| 8,746,169 B2* | 6/2014 | Lee | C23F 1/02 118/504 |
| 8,757,088 B2* | 6/2014 | Lee | C23C 14/04 118/504 |
| 8,881,676 B2* | 11/2014 | Hong | C23C 14/044 118/504 |
| 8,915,213 B2* | 12/2014 | Park | C23C 14/12 118/721 |
| 8,925,480 B2* | 1/2015 | Kim | B05C 21/005 118/721 |
| 9,187,817 B2* | 11/2015 | Kim | C23C 14/042 |
| 9,192,959 B2* | 11/2015 | Hong | C23C 14/12 |
| 9,289,798 B2* | 3/2016 | Park | C23C 14/042 |
| 9,328,407 B2* | 5/2016 | Lee | B05C 21/005 |
| 9,409,203 B2* | 8/2016 | Kim | C23C 16/042 |
| 9,567,662 B2* | 2/2017 | Kim | H01L 51/0011 |
| 9,583,708 B2* | 2/2017 | Ko | C23C 14/042 |
| 9,780,305 B2* | 10/2017 | Kwen | H01L 51/0011 |
| 9,790,586 B2* | 10/2017 | Ko | C23C 14/042 |
| 9,821,416 B2* | 11/2017 | Kim | B23K 37/0408 |
| 9,859,495 B2* | 1/2018 | Kang | B05C 21/005 |
| 9,882,129 B2* | 1/2018 | Jo | C23C 14/042 |
| 10,014,471 B2* | 7/2018 | Baek | C23C 14/042 |
| 10,053,766 B2* | 8/2018 | Kim | C23C 14/042 |
| 10,083,997 B2* | 9/2018 | Kim | B05C 21/005 |
| 10,141,511 B2* | 11/2018 | Kim | H01L 27/3244 |
| 10,186,662 B2* | 1/2019 | Kim | H01L 51/56 |
| 10,196,732 B2* | 2/2019 | Kwon | C23C 14/042 |
| 10,205,116 B2* | 2/2019 | Sun | H01L 51/525 |
| 10,224,350 B2* | 3/2019 | Kim | H01L 51/0011 |
| 10,344,376 B2* | 7/2019 | Hong | C23C 14/042 |
| 10,439,170 B2* | 10/2019 | Lin | H01L 51/0011 |
| 10,533,245 B2* | 1/2020 | Chang | C23C 14/042 |
| 10,625,289 B2* | 4/2020 | Gong | C23C 14/042 |
| 10,663,857 B2* | 5/2020 | Lv | B05C 21/005 |
| 10,741,763 B2* | 8/2020 | Baek | B05D 1/32 |
| 10,897,010 B2* | 1/2021 | Jo | C23C 16/042 |
| 10,901,313 B2* | 1/2021 | Kim | G03F 1/20 |
| 10,964,889 B2* | 3/2021 | Jeong | H01L 51/56 |
| 10,982,314 B2* | 4/2021 | Lin | B05D 1/32 |
| 11,136,663 B2* | 10/2021 | Kim | C23C 14/042 |
| 11,207,705 B2* | 12/2021 | Gong | B23K 31/02 |
| 11,211,558 B2* | 12/2021 | Nakamura | H01L 51/50 |
| 11,214,858 B2* | 1/2022 | Jin | C23C 14/042 |
| 11,316,111 B2* | 4/2022 | Kim | H01L 51/0011 |
| 11,345,988 B2* | 5/2022 | Kim | H01L 51/56 |
| 11,380,546 B2* | 7/2022 | Ushikusa | C23C 14/24 |
| 11,396,030 B2* | 7/2022 | Lee | H01L 51/56 |
| 2004/0115342 A1 | 6/2004 | Shigemura | |
| 2012/0279444 A1* | 11/2012 | Hong | C23C 14/042 118/504 |
| 2012/0279445 A1* | 11/2012 | Kim | C23C 14/042 118/504 |
| 2012/0282445 A1 | 11/2012 | Kim | |
| 2013/0199443 A1* | 8/2013 | Kim | C23C 16/042 118/504 |
| 2013/0298826 A1* | 11/2013 | Park | C23C 14/042 118/504 |
| 2014/0130735 A1* | 5/2014 | Kim | C23C 14/042 118/504 |
| 2014/0331926 A1* | 11/2014 | Kim | C23C 14/042 118/504 |
| 2015/0034005 A1* | 2/2015 | Ko | H01L 51/0011 118/504 |
| 2015/0047560 A1* | 2/2015 | Kang | H01L 27/3223 118/504 |
| 2015/0165464 A1* | 6/2015 | Baek | C23C 14/042 118/504 |
| 2016/0005970 A1* | 1/2016 | Kwen | C23C 16/042 118/504 |
| 2016/0126507 A1* | 5/2016 | Ko | C23C 14/042 438/34 |
| 2016/0144393 A1* | 5/2016 | Kwon | C23C 14/042 118/504 |
| 2016/0167083 A1* | 6/2016 | Kim | C23C 14/042 118/504 |
| 2017/0069843 A1* | 3/2017 | Kang | H01L 51/0011 |
| 2019/0006593 A1* | 1/2019 | Wu | H01L 51/001 |
| 2019/0187502 A1* | 6/2019 | Liu | G02F 1/1337 |
| 2019/0352113 A1* | 11/2019 | Nakamura | B65H 5/222 |
| 2019/0378984 A1 | 12/2019 | Nakamura et al. | |
| 2020/0232091 A1* | 7/2020 | Ahn | C23C 16/042 |
| 2020/0407836 A1* | 12/2020 | Luo | H01L 51/56 |
| 2021/0054494 A1* | 2/2021 | Ding | H01L 51/0011 |
| 2021/0108304 A1* | 4/2021 | Kim | G03F 7/2063 |
| 2021/0187576 A1* | 6/2021 | Wu | B29C 55/00 |
| 2021/0217957 A1* | 7/2021 | Jeong | H01L 51/56 |
| 2021/0249603 A1* | 8/2021 | Kim | H01L 51/0011 |
| 2021/0351351 A1* | 11/2021 | Zhao | H01L 51/001 |
| 2021/0388479 A1* | 12/2021 | Kim | C23C 14/042 |
| 2022/0002859 A1* | 1/2022 | Luo | H01L 51/0011 |
| 2022/0020926 A1* | 1/2022 | Kim | H01L 51/56 |
| 2022/0181595 A1* | 6/2022 | Kim | C23C 14/042 |
| 2022/0267888 A1* | 8/2022 | Kim | C23C 16/042 |

* cited by examiner

US 11,930,690 B2

MASK PLATE

CROSS-REFERENCE TO RELATED APPLICATION

The present application claims priority of Chinese Patent Application No. 202010388822.7 filed to the CNIPA on May 9, 2020, the content of which is hereby incorporated by reference.

TECHNICAL FIELD

Embodiments of the present disclosure relate to, but are not limited to, the technical field of mask plates, in particular to a mask plate.

BACKGROUND

In recent years, the organic light emitting diode (OLED) as a display technology of new generation, has been widely sought after and recognized by the market for its advantages of self-illumination, fast response, wide temperature range and flexible display. With the advent of the 5G era, high-quality, wide and foldable mobile phone screens are gaining popularity. The market share of OLED screen is getting higher and higher in medium and large size, which is a challenge for tensioning equipment of Fine Mental Mask (FMM) plate in an evaporation process.

SUMMARY

The following is a summary of subject matter described in detail herein. This summary is not intended to limit the protection scope of the claims.

The embodiments of the disclosure provide a mask plate, including a rectangular area and two gripper areas which are respectively disposed on two opposite sides of the rectangular area, wherein each of the two gripper areas has a first side and a third side which are arranged opposite to each other, and a second side and a fourth side which are arranged opposite to each other, and the first side is disposed on a side of the rectangular area, and a minimum horizontal spacing between the second side and the fourth side is less than a side length of the first side.

Other aspects will become apparent upon reading and understanding accompanying drawings and the detailed description.

DETAILED DESCRIPTION

Embodiments of the present disclosure are described in detail below. The embodiments described below are exemplary and are only intended to explain the present disclosure, but should not be construed as limitation on the present disclosure. The embodiments in which specific technologies or conditions are not indicated shall be carried out according to technologies or conditions described in literatures in the art or according to a product specification.

Figure 1:
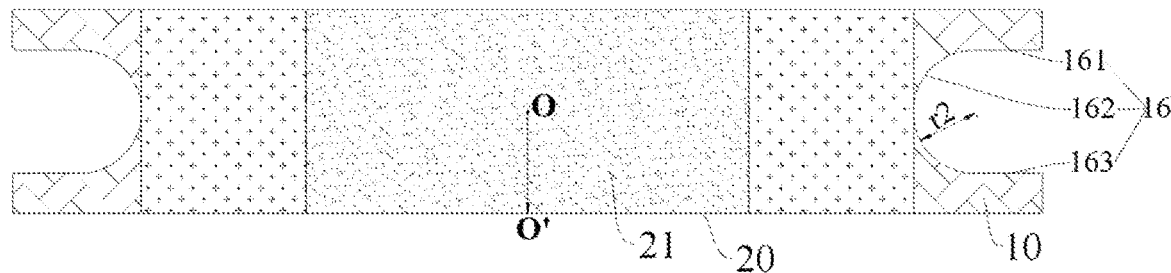
FIG. 1 is a schematic diagram of a structure of a mask plate.

A fine metal mask plate commonly used at present is shown in FIG. 1 (a mask plate 100 includes a rectangular area 20 and gripper areas 10, wherein the rectangular area 20 includes a display area 21 and fixation areas (i.e., areas between the display area 21 and the gripper areas)). On one hand, the design of the structure of the mask plate itself will make the edge of incoming materials upwarp, which is not beneficial to the improvement of sag amount of a AA area (the display area) 21 of the mask plate. On the other hand, with the enlargement of sizes of OLED screens at present, such design of fine metal mask plate will inevitably increase the number of grippers in the gripper areas, which will inevitably increase the complexity of process of tensioning of the fine metal mask plate and is not beneficial to the development of wide fine metal mask plates.

Figure 2:
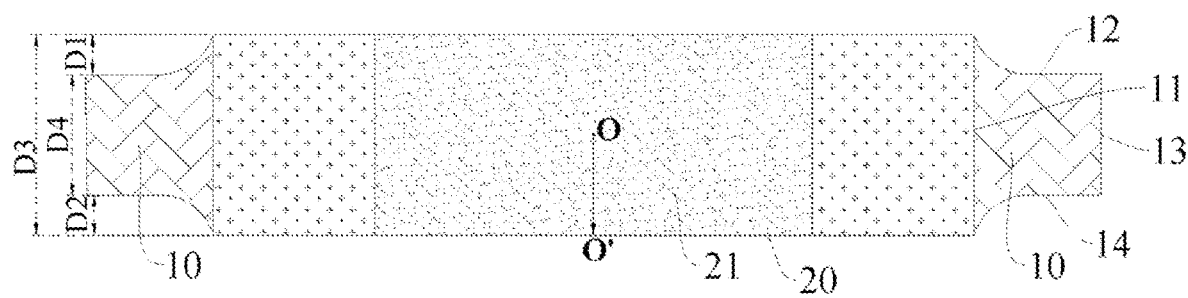
FIG. 2 is a schematic diagram of a structure of a mask plate according to an embodiment of the present disclosure.

An embodiment of the present disclosure provides a mask plate. In an exemplary embodiment of the present disclosure, as shown in FIG. 2, the mask plate 100 includes a rectangular area; two gripper areas 10, wherein the two gripper areas 10 are respectively disposed on two opposite sides of the rectangular area 20. A gripper area 10 has a first side 11 and a third side 13 which are arranged opposite to each other, and a second side 12 and a fourth side 14 which are arranged opposite to each other, wherein the first side 11 is disposed on a side of the rectangular area (which may be understood as that the first side 11 is immediately adjacent to the side of the rectangular area 20, or the first side 11 coincides with the side of the rectangular area), a minimum horizontal spacing D4 between the second side 12 and the fourth side 14 is less than a side length D3 of the first side 11. Therefore, since the gripper area 10 of the mask plate is disposed at a middle position of a side (for example a short side of the mask plate) the rectangular area 20 instead of an edge position, thus the two opposite sides of the mask plate that are not provided with the gripper areas can be prevented from upwarping when the mask plate 100 is tensioned, thereby effectively improving the flatness and sag of the mask plate 100 (especially the display area 21 of the mask plate) and improving "M"-shaped wrinkles that appear when the mask plate is tensioned. Furthermore compared with the mask plate with the structure shown in FIG. 1 (there are at least two sub-gripper areas in each gripper area due to limitation on size of the clamps of the tensioning equipment, as shown in FIG. 1), the mask plate of the embodiment of the present disclosure has fewer gripper areas, which can reduce the complexity of tensioning and simplify the simulation, and can break through the limitation on the size of the mask plate and enables design of a mask plate with a larger size.

In an exemplary embodiment, the rectangular area 20 of the mask plate 100 includes a display area disposed in the middle of the mask plate and fixation areas arranged at two sides of the display area. The display area directly faces an area of evaporated luminescent material in a display panel during tensioning. The display area of the mask plate has multiple openings distributed in an array, and the openings correspond to multiple areas of evaporated luminescent material in the display panel one by one.

In an exemplary embodiment, the gripper areas may be arranged on the short sides of the mask plate, which can be more beneficial to improve the flatness of the mask plate during the tensioning.

In an exemplary embodiment, the mask plate is a fine metal mask plate that may be used for luminescent materials in vacuum evaporation OLED devices.

Figure 3:
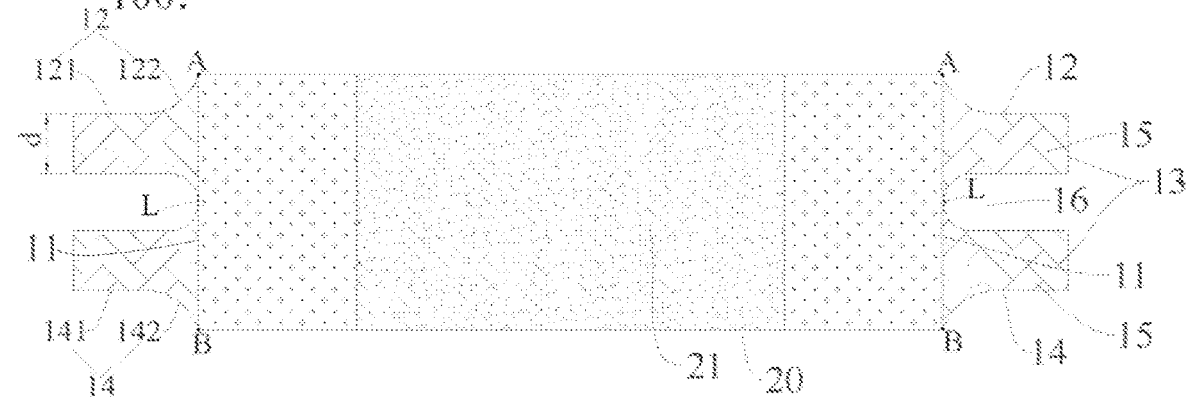
FIG. 3 is a schematic diagram of a structure of a mask plate according to an embodiment of the present disclosure.

In an embodiment of the present disclosure, for example, as shown in FIG. 3, each gripper area 10 includes at least two sub-gripper areas 15 arranged at intervals, and a groove 16 is arranged between two adjacent sub-gripper areas 15 (taking the two sub-gripper areas as an example in FIG. 3). In an example, the gripper area 10 is formed by multiple sub-gripper areas 15 arranged at intervals and separated by the groove 16. Therefore, for a large-sized mask plate, multiple sub-gripper areas may be arranged, so that the clamps of the tensioning equipment can clamp the sub-gripper areas more stably during the tensioning, and the mask plate is uniformly stressed in the clamping process, thus ensuring good flatness of the mask plate.

In an exemplary embodiment, as shown in FIG. 3, when the gripper area includes at least two sub-gripper areas, the third side 13 of the gripper area 10 refers to the sides of all sub-gripper areas 15 away from the rectangular area. In an example, a length of the third side 13 of the gripper area is a sum of lengths d of the sides of all the sub-gripper areas 15 away from the rectangular area.

In an exemplary embodiment, for example, as shown in FIG. 3, the length d of the side of each sub-gripper area away from the first side 11 may be 10 mm to 40 mm, for example 10 mm, mm, 20 mm, 25 mm, 30 mm, 35 mm, or 40 mm. Therefore, it is convenient for the clamps of the tensioning equipment to clamp the sub-gripper area more stably, and ensure the good flatness of the mask plate during the tensioning, thereby effectively reducing the sag amount of the mask plate.

Figure 4:
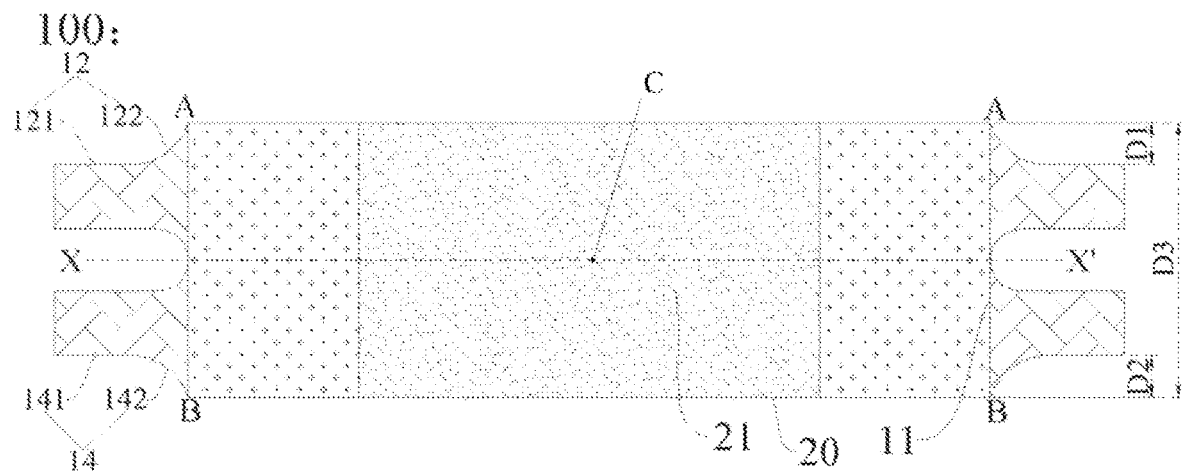
FIG. 4 is a schematic diagram of a structure of a mask plate according to an embodiment of the present disclosure.

In an exemplary embodiment, for example, as shown in FIG. 3 and FIG. 4, the second side 12 includes a first straight line segment 121 and a first arc segment 122, wherein the first straight line segment 121 and the first arc segment 122 are connected with each other, and the first arc segment 122 is connected with the rectangular area 20. The fourth side 14 includes a second straight line segment 141 and a second arc segment 142, wherein the second straight line segment 141 and a second arc segment 142 are connected with each other, and the second arc segment 142 is connected with the rectangular area 20. Therefore, the arrangement of the arc segments (including the first arc segment and the second arc segment) is convenient for the clamps of the tensioning equipment to clamp the gripper area, which improves stress uniformity of the mask plate, and better improves the flatness and sag amount of the mask plate during the tensioning.

Figure 7:
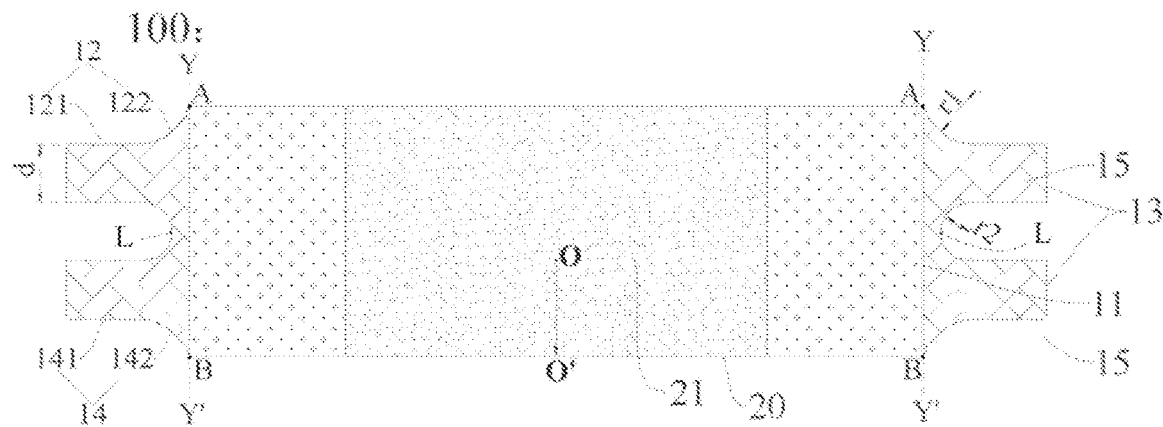
FIG. 7 is a schematic diagram of a structure of a mask plate according to an embodiment of the present disclosure.
Figure 8:
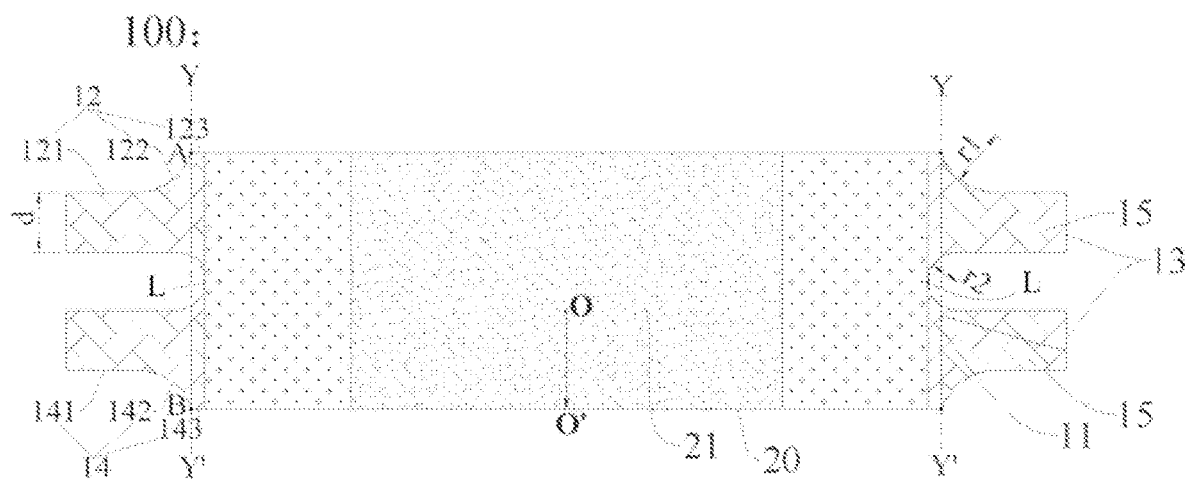
FIG. 8 is a schematic diagram of a structure of a mask plate according to an embodiment of the present disclosure.

In an exemplary embodiment, a connecting line between a vertex of the first arc segment 122 close to the rectangular area 20 and a vertex of the second arc segment 142 close to the rectangular area 20 may be defined as a second straight line Y-Y'. In a length direction of the first straight line segment 121, a lowest point L of a bottom of the groove 16 is on a side of the second straight line Y-Y' away from the rectangular area 20 (as shown in FIG. 7, the straight line Y-Y' and the first side are on the same straight line), or the lowest point L of the bottom of the groove 16 is on a side of the second straight line Y-Y' close to the rectangular area (as shown in FIG. 8, the straight line Y-Y' and the first side are not on the same straight line, and the second side 12 further includes a fifth straight line segment 123 connecting the first arc segment 122 with the first side 11, and the fourth side 14 further includes a sixth straight line segment 143 connecting the second arc segment 142 with the first side 11). Therefore, the flatness and sag amount of the mask plate during the tensioning can be improved in both of the above two cases.

In an exemplary embodiment, for example, as shown in FIG. 3 and FIG. 4, the first side 11, the first arc segment 122 and a first vertex of the rectangular area 20 (the first vertex is a vertex close to the second side 12 of the side of the rectangular area 20 on which the gripper area 10 is disposed) intersect at a first intersection A, and the first side 11, the second arc segment 142 and a second vertex of the rectangular area 20 (the second vertex is a vertex close to the fourth side 14 of the side of the rectangular area 20 on which the gripper area 10 is disposed) intersect at a second intersection B. The first intersection A, the second intersection B and the lowest point L of the bottom of the groove 16 are on a same straight line. Therefore, compared with the mask plates with the structures shown in FIG. 7 and FIG. 8, the flatness and sag amount of the mask plate can be better improved during the tensioning. In an example, if the gripper area contains multiple grooves, the first intersection A, the second intersection B and the lowest points L of the bottoms of the grooves 16 are on the same straight line, which means that the lowest point L of the bottom of each groove, the first intersection A and the second intersection B are all on the same straight line.

In an exemplary embodiment, for example, as shown in FIG. 4, the mask plate 100 is symmetrical with respect to a first straight line X-X', wherein the first straight line X-X' is perpendicular to the first side 11 and passes through a center point C of the rectangular area 20. Therefore, the mask plate can be more uniformly stressed when the clamps of the tensioning equipment clamp the gripper area of the mask plate, which is beneficial to improving the flatness and sag amount of the mask plate during the tensioning.

In an exemplary embodiment, such as FIG. 2 and FIG. 4, in a length direction of the first side, a sum of a horizontal spacing D1 between the first straight line segment 121 and the first intersection A and a horizontal spacing D2 between the second straight line segment 141 and the second intersection B is 30% to 40% of the side length D3 of the first side 11 (i.e., D1+D2=(30% to 40%)*D3). Therefore, when the mask plate 100 is tensioned, it can effectively prevent the two opposite sides of the mask plate which are not provided with gripper areas from upwarping, thereby effectively improving the flatness and sag amount of the mask plate 100 (especially the display area 21 of the mask plate), and improving the "M"-shaped wrinkles that appear when the mask plate is tensioned. In some examples, D1=D2, which can make the stress acted on the mask plate during the tensioning more uniform to better improve the flatness of the mask plate and reduce the sag amount of the mask plate.

Figure 5:
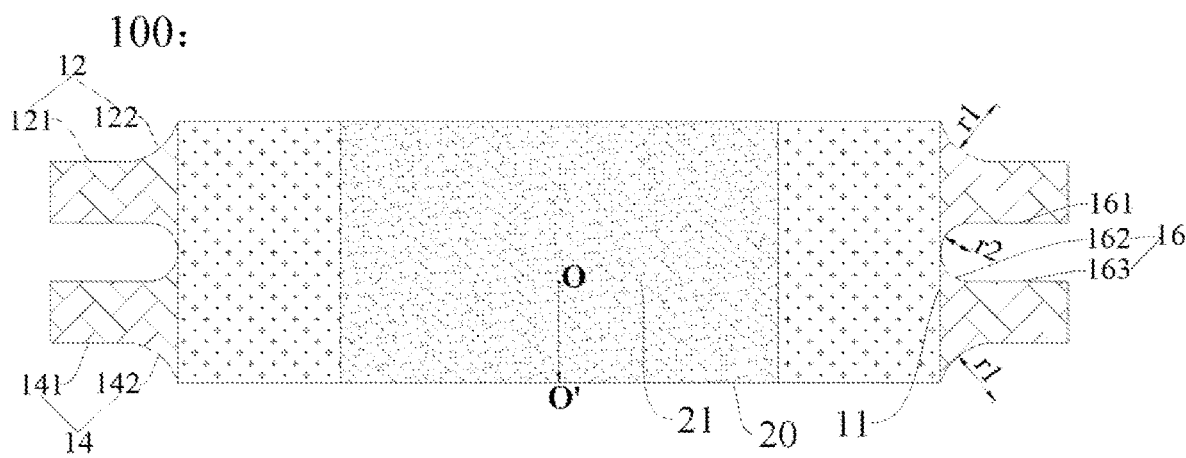
FIG. 5 is a schematic diagram of a structure of a mask plate according to an embodiment of the present disclosure.

In an exemplary embodiment, for example, as shown in FIG. 5, the groove 16 includes a third straight line segment 161, a third arc segment 162 and a fourth straight line segment 163 which are connected in sequence, wherein a radius of the first arc segment 122 and a radius of the second arc segment 142 are both r1, and a radius of the third arc segment 162 is r2, where r1≥r2. Therefore, the mask plate has better flatness and lower sag amount during the tensioning, and the length d of the side of each sub-gripper area away from the first side can effectively meet the limitation requirements of the tensioning equipment and process conditions.

In an exemplary embodiment, r1−r2 is ≤20 mm (for example, a difference between r1 and r2 is 20 mm, 18 mm, 15 mm, 10 mm, 8 mm, 5 mm, 3 mm, 2 mm, 1 mm or 0). The smaller the difference between r1 and r2 is, the better the flatness of the mask plate and the smaller the sag amount of the mask plate during the tensioning. In some examples, r1=r2, which improves the flatness of the mask plate.

In an exemplary embodiment, the lengths of the first straight line segment, the second straight line segment, the third straight line segment and the fourth straight line segment are respectively 10 to 20 millimeters (for example 10 mm, 12 mm, 14 mm, 16 mm, 18 mm or 20 mm). Therefore, the straight line segments with the above lengths may be beneficial to clamping the gripper area by the clamps of the tensioning equipment. If the length is less than 10 mm, it is relatively unfavorable for clamping the gripper area by the clamps of the tensioning equipment. If the length is greater than 20 mm, a sub-gripper area being too long in size will reduce the improvement of the flatness of the mask plate during the tensioning accordingly.

In an exemplary embodiment, the mask plate is symmetrical with respect to the first straight line X-X', so the length of the first straight line segment is equal to the length of the second straight line segment, and the length of the third straight line segment is equal to the length of the fourth straight line segment, and the radius of the first arc segment is equal to the radius of the second arc segment. There is no limitation on a size relations between the length of the first straight line segment (or the length of the second straight line segment) and the length of the third straight line segment (or the length of the fourth straight line segment), and designs can be flexibly made by those skilled in the art according to actual requirements, that is, the length of the first straight line segment may be greater than, less than or equal to the length of the third straight line segment.

In an exemplary embodiment, those skilled in the art may flexibly select r1 to be 15 to 30 mm (for example 15 mm, 18 mm, 20 mm, 22 mm, 24 mm, 26 mm, 28 mm or 30 mm) and r2 to be 15 to 25 mm (for example 15 mm, 18 mm, 20 mm, 22 mm and 24 mm) according to actual requirements such as the mask plate's size. Therefore, the design requirements of mask plates with different sizes can be met, which is beneficial to the stability of mask plates during the tensioning, the stress uniformity of mask plates is improved, and then the flatness of mask plates is improved.

EMBODIMENTS

Embodiment 1

In an embodiment of the present disclosure, a schematic diagram of a structure of a fine metal mask plate is shown in FIG. 2, and the gripper area 10 includes a sub-gripper area, where D1=D2=10 mm, D1+D2=(0.3 to 0.4)*D3, a radius of the first arc segment of the second side and a radius of the second arc segment of the fourth side r1=10 mm, r1−r2≤20 mm, and the length d of the side of each sub-gripper area away from the first side is 10 mm to 40 mm.

Comparative Example 1

A schematic diagram of a structure of a fine metal mask plate is shown in FIG. 1, the gripper area 10 includes two sub-gripper areas, and the rectangular area of the mask plate keeps the same size.

Figure 6:
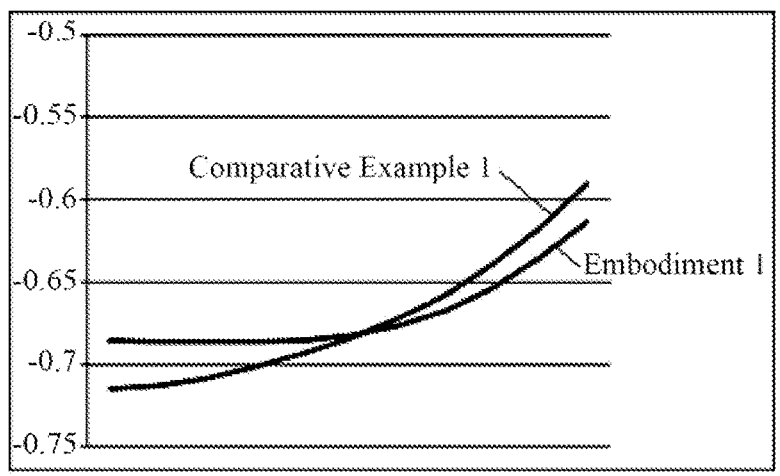
FIG. 6 is a simulation diagram of sag curves of mask plates in Embodiment 1 and Comparative example 1.

In a direction of the first side 11, a simulation diagram of the sag amount curves from a center point O to an edge point O' of the mask plate in the display areas 21 of the mask plates in Embodiment 1 and Comparative Example 1 can refer to FIG. 6, in which the smaller the difference of sag amount between the point O and the point O' is, and the smaller the sag amount of the two points has, the better the flatness of the mask plate during the tensioning has. It can be seen from FIG. 6 that the difference between a maximum value (i.e., sag amount at the point O) and a minimum value (i.e., sag amount at the point O') of the sag amount of the mask plate in Embodiment 1 is 73.3 μm, and the difference between a maximum value (i.e., sag amount at the point O) and a minimum value (i.e., sag amount at the point O') of the sag amount of the mask plate in Comparative Example 1 is 124 μm. It can be seen that the flatness of the mask plate during the tensioning in Embodiment 1 is better and the sag amount of the mask plate is improved. Compared with Comparative Example 1, the flatness of the mask plate in Embodiment 1 can be improved by about 40%. In addition, Compared with Comparative Example 1, the mask plate in Embodiment 1 is reduced by one sub-gripper area, which is more beneficial to the simulation and tensioning of the mask plate, and simplifies the tensioning process.

Embodiment 2

In an embodiment of the present disclosure, a schematic diagram of a structure of a fine metal mask plate is shown in FIG. 7, the gripper area 10 includes two sub-gripper areas, where D1=D2=34.26 mm, D1+D2=(0.3 to 0.4)*D3, r1=34.26 mm, and r1−r2≤20 mm, and the length d of the side of each sub-gripper area away from the first side is 10 mm to 40 mm. The first intersection A, the second intersection B, and the lowest point of the bottom of the groove are not on the same straight line.

Embodiment 3

In an embodiment of the present disclosure, a schematic diagram of a structure of a fine metal mask plate is shown in FIG. 3 to FIG. 5, and the gripper area 10 includes two sub-gripper areas, where D1=D2=27.13 mm, D1+D2=(0.3 to 0.4)*D3, r1=27.13 mm, r1−r2≤20 mm, and the length d of the side of each sub-gripper area away from the first side is 10 mm to 40 mm (and is equal to the length d of the side of each sub-gripper area away from the first side in Embodiment 2). The first intersection A, the second intersection B, and the lowest point of the bottom of the groove are on the same straight line.

Embodiment 4

In an embodiment of the present disclosure, a schematic diagram of a structure of a fine metal mask plate is shown in FIG. 3 to FIG. 5, and the gripper area 10 includes two sub-gripper areas, where D1=D2=24.13 mm, D1+D2=(0.3 to 0.4)*D3, r1=24.13 mm, r1−r2≤20 mm, and the length d of the side of each sub-gripper area away from the first side is 10 mm to 40 mm (and the length d of the side of each sub-gripper area away from the first side is greater than the length d of the side of each sub-gripper area away from the first side in Embodiment 3). The first intersection A, the second intersection B, and the lowest point of the bottom of the groove are on the same straight line.

Comparative Example 2

Figure 9:
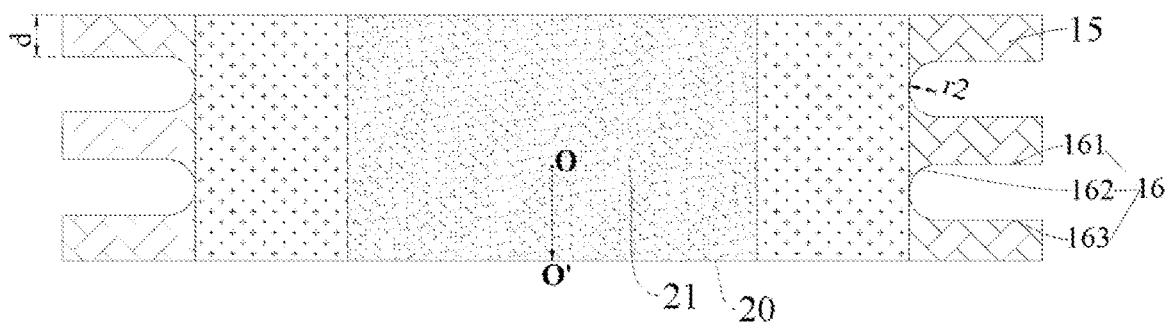
FIG. 9 is a schematic diagram of a structure of a mask plate in a Comparative example 2.

In a comparative embodiment of the present disclosure, a schematic diagram of a structure of a fine metal mask plate is shown in FIG. 9, and the gripper area 10 includes three sub-gripper areas 15.

Figure 10:
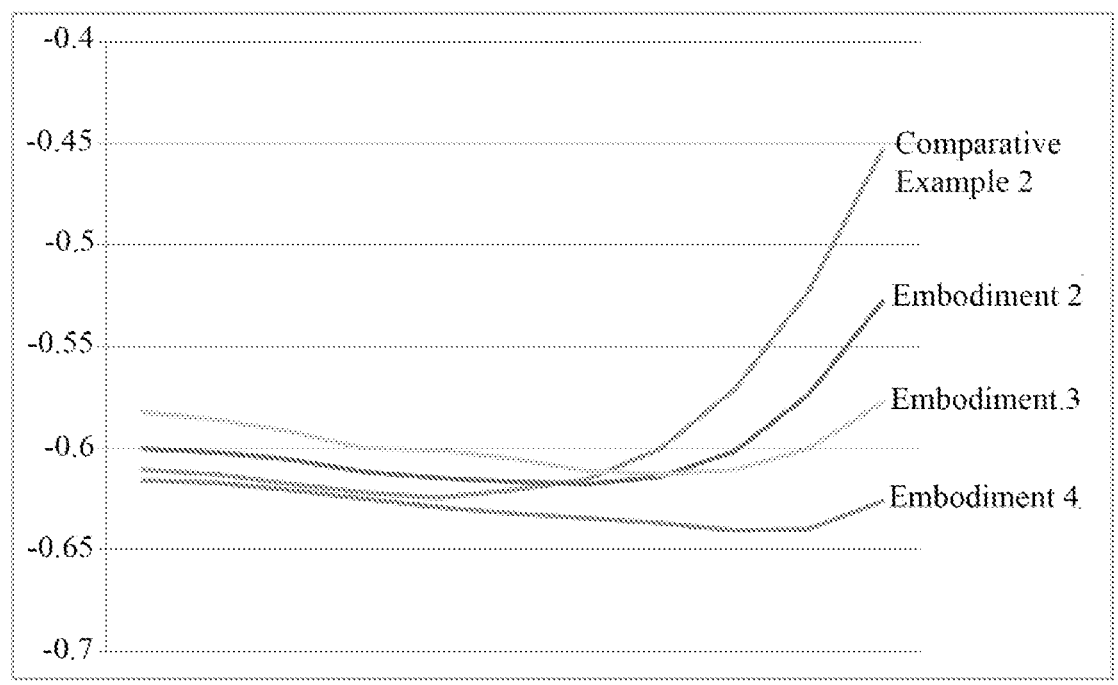
FIG. 10 is a simulation diagram of sag amount curves of mask plates in Embodiments 2 to 4 and Comparative example 2.

In the direction of the first side 11, a simulation diagram of the sag amount curves from a center point O to an edge point O' of the mask plates in the display area 21 of the mask plates in Embodiments 2 to 4 and Comparative Example 2 can refer to FIG. 10. It can be seen from FIG. 10 that a difference between a maximum value (i.e., sag amount at the point O) and a minimum value (i.e., sag amount at the point O') of the sag amount of the mask plate in Embodiment 2 is 90 μm, a difference between a maximum value (i.e., sag amount at the point O) and a minimum value (i.e., sag amount at the point O') of the sag amount of the mask plate in Embodiment 3 is 35.2 μm, a difference between a maximum value (i.e., sag amount at the point O) and a minimum value (i.e., sag amount at the point O') of the sag amount of the mask plate in Embodiment 4 is 25 μm, and a difference between a maximum value (i.e., sag amount at the point O) and a minimum value (i.e., sag amount at the point O') of the sag amount of the mask plate in Comparative Example 2 is 170.6 μm. It can be seen from the comparison of Embodiments 2 and 3 that when the first intersection A, the second intersection B and the lowest point of the bottom of the groove are on the same straight line, improvement effect on the flatness of the mask plate is better. It can be seen from the comparison of Embodiments 3 and 4 that the greater the length of the side of the sub-gripper away from the first side is, the more beneficial it is to improve the flatness of the mask during the tensioning and reduce the sag amount. Compared with Comparative Example 2, the flatness of the mask plates in Embodiments 2 to 4 can be improved by about 47.2%, 79.4%, 85.3%, respectively. In addition, Compared with Comparative Example 2, the mask plates in Embodiments 2 to 4 are each reduced by one sub-gripper area, which is better beneficial to the simulation and tensioning of the mask plate, and simplifies the tensioning process.

The terms "first" and "second" herein are used for description purposes only, and cannot be construed as indicating or implying relative importance or implicitly indicating the number of technical features referred to. Thus, features defined by "first" and "second" may include one or more of the features explicitly or implicitly. In the description of the present disclosure, unless defined otherwise explicitly "a plurality of" means two or more than two.

In the description of the specification of the present disclosure, description made with reference to terms "an embodiment", "some embodiments", "an example", "a specific example" or "some examples" means that a specific feature, structure, material, or characteristic described in connection with the embodiment or example is included in at least one embodiment or example of the present disclosure. In the specification of the present disclosure, the schematic expression of the above-mentioned terms is not necessarily directed to the same embodiment or example. Moreover, the specific feature, structure, material, or characteristic described may be combined in a proper way in any one or more embodiments or examples. In addition, those skilled in the art may incorporate and combine different embodiments or examples and features of the different embodiments or examples described in the specification of the present disclosure without conflict.

Although the embodiments of the present disclosure have been shown and described above, it should be understood that the above embodiments are exemplary, and can not be understood as limitation on the present disclosure. Changes, modifications, substitutions and variations to the above embodiments may be made by those skilled in the art within the scope of the present disclosure.

What we claim is:

1. A mask plate, comprising:
   a rectangular area; and
   two gripper areas which are respectively disposed on two opposite short sides of the rectangular area, wherein each of the two gripper areas has a first side and a third side which are arranged opposite to each other, and a second side and a fourth side which are arranged opposite to each other, and the first side is one of the two opposite short sides of the rectangular area, each of the second side and the fourth side is not on a same line with any of two long sides of the rectangular area, and a minimum horizontal spacing between the second side and the fourth side is less than a side length of the first side, wherein:
   each of the two gripper areas comprises at least two sub-gripper areas arranged at intervals, each of two outmost sub-gripper areas of the at least two sub-gripper areas is axisymmetric, and each of the two outmost sub-gripper areas comprises two arc segments;
   a groove is formed between two adjacent sub-gripper areas;
   the second side comprises a first straight line segment and a first arc segment which are connected with each other, and the first arc segment is connected with the rectangular area, and the fourth side comprises a second straight line segment and a second arc segment which are connected with each other, and the second arc segment is connected with the rectangular area; and
   the first arc segment is intersected with a long side of the two long sides of the rectangular area and an intersection point is a first vertex; the second arc segment is intersected with another long side of the two long sides of the rectangular area and an intersection point is a second vertex, a connection line between the first vertex and the second vertex is defined as the second straight line segment, and in a direction perpendicular to the second straight line segment, a lowest point of a bottom of the groove is not located on the second straight line segment and is located on a side of the second straight line segment, the second straight line segment is not located in a same line with any of the two opposite short sides of the rectangular area.

2. The mask plate according to claim 1, wherein the mask plate is symmetrical with respect to a first straight line which is perpendicular to the first side and passes through a center point of the rectangular area.

3. The mask plate according to claim 1, wherein in a length direction of the first side, a sum of a horizontal spacing between the first straight line segment and the first intersection and a horizontal spacing between the second straight line segment and the second intersection is 30% to 40% of the side length of the first side.

4. The mask plate according to claim 1, wherein the groove comprises a third straight line segment, a third arc segment and a fourth straight line segment which are connected in sequence, wherein a radius of the first arc segment and a radius of the second arc segment are both r1, and a radius of the third arc segment is r2, wherein r1≥r2.

5. The mask plate according to claim 4, wherein r1−r2≤20 mm.

6. The mask plate according to claim 4, wherein the length of each of the first straight line segment, the second straight line segment, the third straight line segment and the fourth straight line segment is 10 to 20 mm respectively.

7. The mask plate according to claim 4, wherein r1 is 15 to 30 mm, and r2 is 15 to 25 mm.

8. The mask plate according to claim 1, wherein a length of a side of each of the at least two sub-gripper areas away from the first side is 10 mm to 40 mm.

9. The mask plate according to claim 1, wherein the two gripper areas are respectively disposed on the two opposite short sides of the rectangular area.

10. The mask plate according to claim 1, wherein the mask plate is a fine metal mask plate.

11. The mask plate according to claim 1, wherein when each of the two gripper areas includes at least two sub-gripper areas, the third side of the gripper area refers to sides of all sub-gripper areas away from the rectangular area.

12. The mask plate according to claim 3, wherein in the length direction of the first side, the horizontal spacing between the first straight line segment and the first intersection is equal to the horizontal spacing between the second straight line segment and the second intersection.

13. The mask plate according to claim 4, wherein r1=r2.

14. The mask plate according to claim 4, wherein a length of the first straight line segment is equal to a length of the second straight line segment, a length of the third straight line segment is equal to a length of the fourth straight line segment, and the radius of the first arc segment is equal to the radius of the second arc segment.

15. The mask plate according to claim 1, wherein the rectangular area comprises a display area disposed in the middle of the rectangular area and fixation areas disposed on two sides of the display area.

16. The mask plate according to claim 15, wherein the display area of the mask plate has a plurality of openings distributed in an array.

17. The mask plate according to claim 1, wherein each sub-gripper area of the at least two sub-gripper areas is axisymmetric.

18. The mask plate according to claim 1, wherein each sub-gripper area of the at least two sub-gripper areas comprises two arc segments.

* * * * *